(12) United States Patent
Moon et al.

(10) Patent No.: US 8,519,399 B2
(45) Date of Patent: Aug. 27, 2013

(54) ARRAY SUBSTRATE FOR DISPLAY DEVICE AND METHOD FOR FABRICATING THE SAME

(75) Inventors: Kyo-Ho Moon, Daegu (KR); Byung-Yong Ahn, Gyeonggi-Do (KR); Hee-Kyoung Choi, Gyeongsangbuk-Do (KR); Chul-Tae Kim, Gyeongsangbuk-Do (KR); Sung-Wook Hong, Gyeongsangbuk-Do (KR); Seung-Woo Jeong, Gyeonggi-Do (KR); Yong-Soo Cho, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/543,474

(22) Filed: Jul. 6, 2012

(65) Prior Publication Data

US 2012/0267631 A1 Oct. 25, 2012

Related U.S. Application Data

(62) Division of application No. 12/640,613, filed on Dec. 17, 2009, now Pat. No. 8,237,163.

(30) Foreign Application Priority Data

Dec. 18, 2008 (KR) .................. 10-2008-0129601
Dec. 3, 2009 (KR) .................. 10-2009-0119349

(51) Int. Cl.
*H01L 29/04* (2006.01)

(52) U.S. Cl.
USPC 257/59; 257/72; 257/E27.111; 257/E27.121; 257/E29.291; 438/29; 438/158

(58) Field of Classification Search
USPC ....... 257/59, 72, E27.111, E27.121, E29.291; 438/29, 158
See application file for complete search history.

(56) References Cited

U.S. PATENT DOCUMENTS

| 6,861,368 | B2 | 3/2005 | Chae | |
|---|---|---|---|---|
| 7,061,020 | B2 | 6/2006 | Chae | |
| 2003/0127649 | A1* | 7/2003 | Chae | 257/72 |
| 2004/0041958 | A1* | 3/2004 | Hwang et al. | 349/43 |

FOREIGN PATENT DOCUMENTS

| KR | 2001-0081859 | 8/2001 |
|---|---|---|
| KR | 2003-0056254 | 7/2003 |
| KR | 10-2006-0097924 | 9/2006 |
| TW | I 294184 | 3/2008 |
| TW | I 302999 | 11/2008 |

* cited by examiner

*Primary Examiner* — Tu-Tu Ho
(74) *Attorney, Agent, or Firm* — McKenna Long & Aldridge LLP

(57) ABSTRACT

An array substrate for a display device and its fabrication method are disclosed. The array substrate for a display device includes: a gate wiring and a gate electrode connected to the wiring formed on a substrate; a gate insulating layer formed on the gate electrode; an active layer and a barrier metal layer stacked with the gate insulating layer interposed therebetween on the gate electrode; a data wiring formed on the barrier metal layer and source and electrodes connected to the data wiring; a passivation film formed on the source and drain electrodes and the data wiring and having a contact hole exposing a portion of the drain electrode, the barrier metal layer and the active layer; and a pixel electrode formed on the passivation film and being in contact with the drain electrode and the barrier metal layer including the active layer.

11 Claims, 10 Drawing Sheets

ARRAY SUBSTRATE FOR DISPLAY DEVICE AND METHOD FOR FABRICATING THE SAME

CROSS-REFERENCE TO RELATED APPLICATIONS

This application is a Divisional of application Ser. No. 12/640,613 filed Dec. 17, 2009 now U.S. Pat. No. 8,237,163, now allowed, which claims priority to Korean Patent Application No. 10-2008-0129601, filed Dec. 18, 2008, and Korean Patent Application No. 10-2009-0119349, filed Dec. 3, 2009 all of which are hereby incorporated by reference for all purposes as if fully set forth herein.

BACKGROUND OF THE INVENTION

1. Field of the Invention

The present invention relates to an array substrate for a display device and, more particularly, to an array substrate for a display device capable of minimizing a contact resistance between a pixel electrode and a metal wiring by making the metal wiring (for example, including source/drain electrode, a gate pad, a data pad, driving circuit, GIP (gate in panel) or metal wiring of ESD circuit) brought into contact with a barrier metal, and its fabrication method.

2. Description of the Related Art

In general, a metal wiring serves to relay signals to an element. The metal wiring relaying signals is low-priced and has a low resistance value, and as the metal has a strong corrosion resistance, it can contribute to high reliability and price competitiveness of a product.

In most cases, the quality of an array substrate, a first substrate, of a liquid crystal display (LCD), is determined according to which material is used for each element or according to which specification each element is designed.

For example, a small LCD device does not matter, but in case of a large-scale high resolution LCD device having a size of 18 inches or larger, a unique resistance value of materials used for gate wirings and data wirings are a key factor for determining the superiority of picture quality.

Accordingly, in case of the large-scale/high resolution LCD device, it is preferred to use a metal with a low resistance such as aluminum or an aluminum alloy as a material of the gate wirings or data wirings.

Pure aluminum has a chemically weak corrosion-resistance and a hillock (H) is generated from the surface of the gate wirings and the gate electrodes at a follow-up high temperature process. The hillock (H) may induce an abnormal growth of a gate insulating layer covering the gate wirings and the gate electrodes and cause a short circuit due to an insulation breakdown between an active layer and the gate electrode, failing to serve as a switching element.

Thus, in case of the aluminum wiring, it is used in the form of an alloy or a laminated structure is used. However, when the gate wirings are formed to be laminated, a process should be additionally performed, disadvantageously.

Recently, in an effort to avoid such problem, copper (Cu) which can be available for forming wirings through a simple process, has a low resistance and is low-priced is proposed to be used.

The related art array substrate for a display device using copper will now be described with reference to FIGS. 1 and 2.

FIG. 1 is a schematic sectional view of the related art array substrate for a display device.

FIG. 2 is a schematic sectional view of the related art array substrate for a display device, showing a copper oxide film formed on the surface where a drain electrode and a pixel electrode are in contact with each other.

With reference to FIG. 1, the related art array substrate for a display device includes gate wirings (not shown) formed to extend in one direction on a transparent substrate 11, and a data wiring (not shown) vertically crossing the gate wiring with a gate insulating layer 15 interposed therebetween to define a pixel area (not shown).

Here, although not shown, a thin film transistor (TFT) (not shown), a switching element, is formed at a crossing of the gate wiring (not shown) and the data line (not shown). The TFT includes a gate electrode 13 extending from the gate wiring, a source electrode 21 extending from the data wiring, and an active layer 17 forming a channel with a drain electrode 23 spaced apart by a certain distance from the source electrode 21. The source electrode 21 and the drain electrode 23 are made of copper (Cu) which has a low resistance and is low-priced. The active layer 17 is formed on the gate insulating layer 15 above the gate electrode 13 and formed of pure amorphous silicon layer.

A molybdenum titanium (MoTi) layer 19 is formed as a barrier metal layer between the source and drain electrodes 21 and 23 and the active layer 17. The molybdenum titanium (MoTi) layer 19 serves to prevent copper (Cu) constituting the source and drain electrodes 21 and 23 and the active layer 17 from being brought into direct contact with each other to interact.

A passivation layer 25 for protecting the TFT, the gate wirings and the data wirings is formed on the substrate 11.

A pixel electrode 29 is formed on the passivation layer 25 of the pixel area and is electrically in contact with the drain electrode 23 via a contact hole 27 formed by etching the passivation layer 25. The pixel electrode 29 is made of a transparent metal material such as ITO (or IZO).

Meanwhile, the pixel electrode is in contact with a metal wiring including the source/drain electrodes, a gate pad, a data pad, the pad portion of driving circuit, the GIP (gate in panel) or the metal wiring of ESD circuit. In the case of the metal wiring of the pad portion, not shown, a copper oxide film (Cu2O) is formed between the metal wiring and the pixel electrode, so that contact characteristics between the pixel electrode and the metal wiring is deteriorated.

As the above, the related art array substrate for a display device has the following problems.

That is, in the related art array substrate for a display device, when the pixel electrode is formed after the contact hole is formed at the passivation film, a copper oxide film (Cu2O) is generated on the drain electrode in contact with the pixel electrode due to the influence of H2O gas as shown in FIG. 2, to degrade contact characteristics between the pixel electrode and the drain electrode. Namely, the signal transferred to the pixel electrode is transferred via the source and drain data wirings. And, the copper oxide film (Cu2O) is formed between the metal wiring and the pixel electrode, so that contact characteristics between the pixel electrode and the metal wiring are deteriorated. In a situation that the same voltage is applied to the gate wirings, a current inputted to the pixel electrode is determined by resistance of the channel and resistance at the contact portion between the pixel electrode and the drain electrode.

Accordingly, although the contact resistance between the copper wiring and the pixel electrode is low, because the surface of the copper wiring is oxidized due to the processing conditions, the contact resistance is increased.

Thus, because the contact resistance between the drain electrode, the copper wiring, and the pixel electrode, is increased, when a low Vgs voltage is applied, TFT charging characteristics is not good compared with a case where a different metal such as aluminum is applied.

Thus, in the related art array substrate for a display device, the increase in the contact resistance between the drain electrode and the pixel electrode, or the contact resistance between the copper wiring (including the source/drain electrode, the pad portion of driving circuit, the GIP (gate in panel) or the metal wiring of ESD circuit) and the pixel electrode, causes a signal delay.

SUMMARY OF THE INVENTION

An object of the embodiments of the invention is to provide an array substrate for a display device capable of improving electrical characteristics of a thin film transistor (TFT) by making a pixel electrode contact with a metal wiring (for example, including source/drain electrode, a gate pad, a data pad, driving circuit, GIP or metal wiring of ESD circuit) a barrier metal layer to thus reduce a contact resistance between the metal wiring and the pixel electrode, and its fabrication method.

According to an aspect of the present invention, there is provided an array substrate for a display device, comprising: a gate wiring and a gate electrode connected to the gate wiring formed on a substrate; a gate insulating layer formed on the substrate including the gate electrode; an active layer and a barrier metal layer stacked with the gate insulating layer interposed therebetween on the gate electrode; a data wiring formed on the barrier metal layer and source and electrodes connected to the data wiring; a passivation film formed on the source and drain electrodes and the data wiring and having a contact hole exposing the drain electrode and the barrier metal layer; and a pixel electrode formed on the passivation film and being in contact with the drain electrode and the barrier metal layer including the active layer.

According to another aspect of the present invention, there is provided a method for fabricating an array substrate for a display device, including: forming a gate wiring and a gate electrode connected to the gate wiring on a substrate; forming a gate insulating layer on the gate electrode; forming an active layer on the gate electrode with the gate insulating layer interposed therebetween; forming a barrier metal layer, a data wiring, and source and drain electrodes connected to the data wiring on the active layer; forming a passivation film on the source and drain electrodes and the data wiring; selectively etching portions of the passivation film and the drain electrode to form a contact hole exposing a portion of the drain electrode and the barrier metal layer including the active layer; and forming a pixel electrode on the passivation film, the pixel electrode being in contact with the drain electrode and the barrier metal layer, and the active layer.

According to an aspect of the present invention, there is provided an array substrate for a display device, comprising: a barrier metal layer and a metal wiring formed on a substrate; an insulating layer formed on the substrate including the metal wiring and the barrier metal layer; a passivation film formed on the insulating layer, and having a contact hole exposing a portion of the active layer, the drain electrode and the barrier metal layer; and a conductive layer pattern formed on the passivation film and being in contact with the exposed metal wiring and the barrier metal layer including the active layer through the contact hole.

According to another aspect of the present invention, there is provided a method for fabricating an array substrate for a display device, comprising: forming a barrier metal layer and a metal wiring on a substrate; forming an insulating layer and a passivation layer on the substrate including the metal wiring and the barrier metal layer; selectively etching the passivation film and the insulating layer to form a contact hole exposing a portion of the metal wiring and the barrier metal layer; and forming a conductive layer pattern on the passivation film and being in contact with the exposed metal wiring and the barrier metal layer including the active layer through the contact hole.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims thereof as well as the appended drawings.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

An array substrate for a display device and its fabrication method according to exemplary embodiments of the present invention will now be described in detail with reference to the accompanying drawings.

Figure 1:
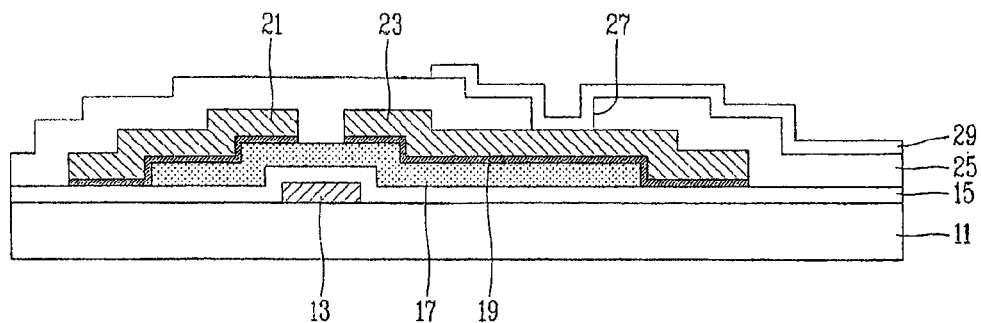
FIG. 1 is a schematic sectional view of an array substrate for a display device according to the related art.
Figure 2:
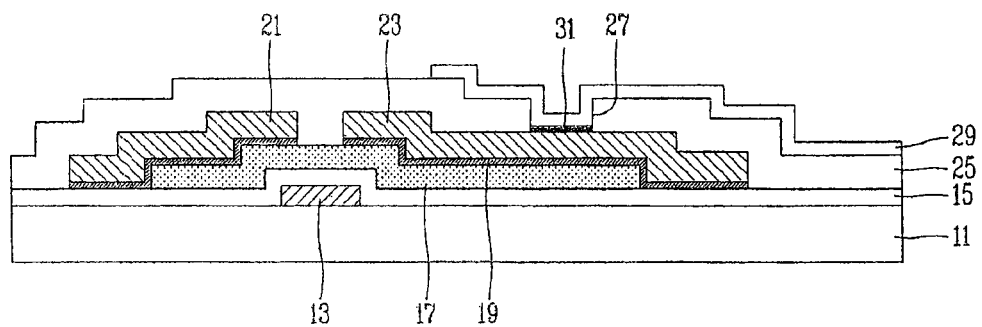
FIG. 2 is a schematic sectional view of the array substrate for a display device according to the related art, showing a copper oxide film formed on a contact surface of a drain electrode and a pixel electrode.
Figure 3:
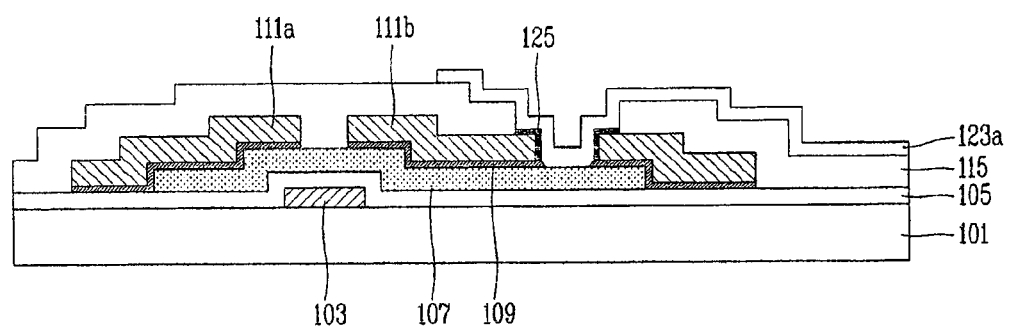
FIG. 3 is a schematic sectional view of an array substrate for a display device according to an embodiment of the present invention.

FIG. 3 is a schematic sectional view of an array substrate for a display device according to an embodiment of the present invention.

With reference to FIG. 3, the array substrate for a display device according to an embodiment of the present invention includes gate wirings (not shown) formed to extend in one direction on a transparent substrate 101, and data wirings (not shown) vertically crossing the gate wirings (not shown) with a gate insulating layer 105 interposed therebetween to define pixel areas (not shown). In forming the gate wirings (not shown), metal wirings (not shown) in a gate/data pad, a driving circuit portion, GIP or a metal wiring of a ESD (electrostatic discharge) circuit portion, are formed, simultaneously.

Here, although not shown, a thin film transistor (TFT) (not shown) is formed at each crossing of the gate wirings (not shown) and the data wirings (not shown). The TFT includes a gate electrode 103 extending from the gate wiring, a source electrode 111a extending from the data wiring, a drain electrode 111b spaced apart by a certain distance from the source electrode 111a, and an active layer 107 forming a channel. The metal wirings (for example, the gate wiring, the gate/data pads, the driving circuit portion, GIP or a metal wiring in the ESD circuit portion), and source electrode 111a and the drain electrode 111b are made of copper, a metal which has a low resistance and is low-priced.

The active layer 107 is formed on the gate insulating layer 105 at an upper portion of the gate electrode 103, and formed of a pure amorphous silicon layer.

A barrier metal layer 109 made of a molybdenum alloy is formed between the source and drain electrodes 111a and 111b and the active layer 107. At this time, the barrier metal layer 109 serves to prevent copper (Cu) constituting the source and drain electrodes 111a and 111b and the semiconductor layer 107 from being in direct contact to interact. And, not shown, a barrier metal wiring may be formed under the gate wiring, the metal wiring of the gate/data pad, a pad (not shown) of driving circuit portion, GIP or the metal wiring of ESD (electro static discharge) circuit portion.

The molybdenum alloy constituting the barrier metal layer 109 may be one selected from the group consisting of titanium (Ti), tantalum (Ta), chromium (Cr), nickel (Ni), indium (In), and aluminum (Al). Here, the case where titanium (Ti) is used as the molybdenum alloy will now be described.

A passivation film 115 is formed on the substrate 101 to protect the TFT, the gate wiring and the data wiring.

A pixel electrode 123a is formed on the passivation film 115 of a pixel area and is in electrically contact with the barrier metal layer 109 together with the drain electrode 111b via a contact hole (See 121 in FIG. 4m) formed by etching portions of the passivation film 115 an the drain electrode 111b. The pixel electrode 123a is made of ITO (or IZO), a transparent metal material. A copper oxide film 125 is formed on the drain electrode 111b in contact with the pixel electrode 123a, and it is not formed on the barrier metal layer 109 in contact with the drain electrode 111b.

Thus, in the embodiment of the present invention, because the copper oxide film 125 is not formed between the pixel electrode 123a and the barrier metal layer 109 made of MoTi, high resistance component at a low voltage can be lowered.

In addition, in the present invention, by using the ohmic-contact characteristics of the barrier metal layer 109 and the pixel electrode 123a, the TFT charging characteristics at a low Vds voltage can be improved and a linear mobility can be also improved to greatly affect the characteristics of a model product.

The method for fabrication the array substrate for a display device according to an embodiment of the present invention will now be described with reference to FIGS. 4a to 4o.

Figure 4A:
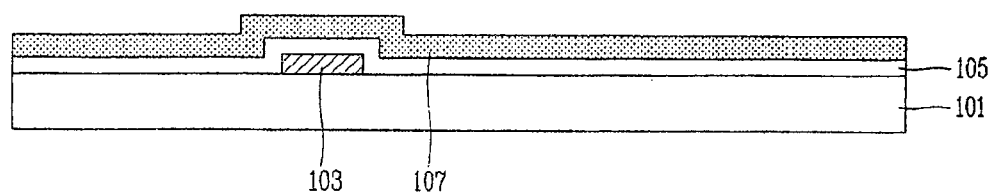
FIGS. 4a to 4o are sectional views sequentially showing a fabrication process of the array substrate for a display device according to an embodiment of the present invention.
Figure 4B:
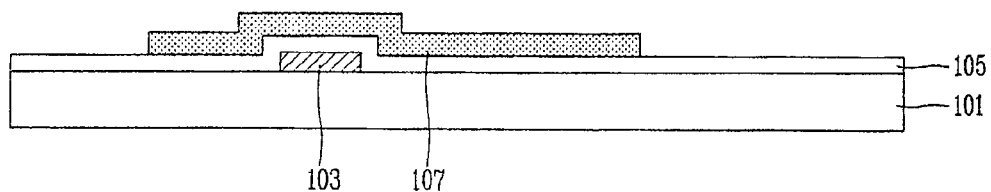
Figure 4C:
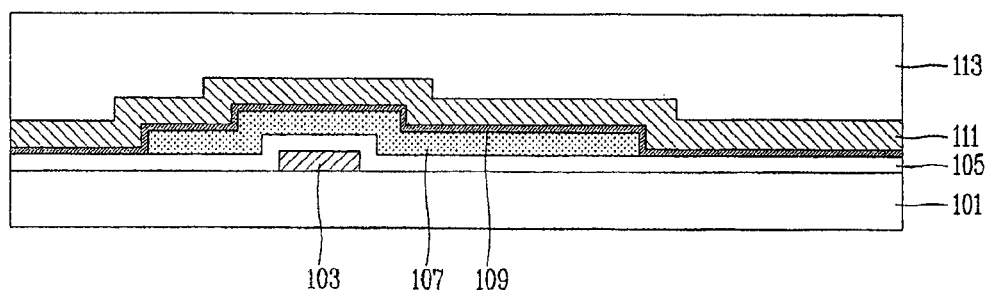
Figure 4D:
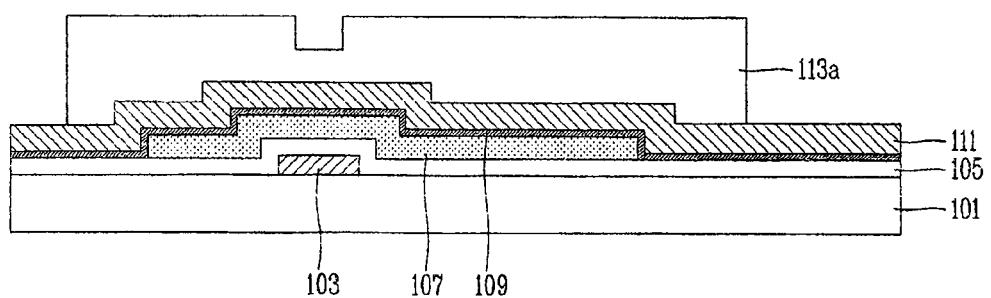
Figure 4E:
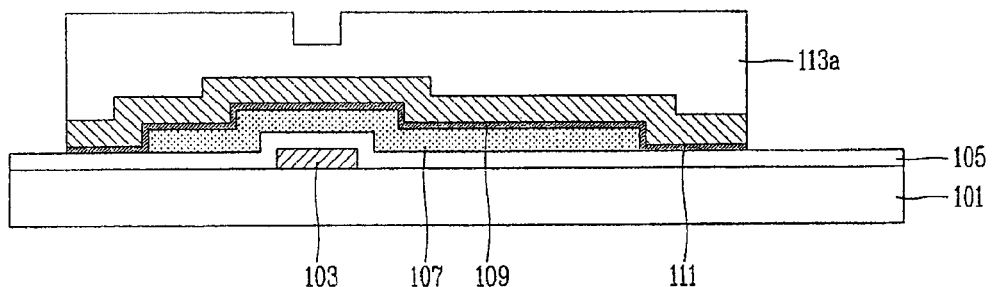
Figure 4F:
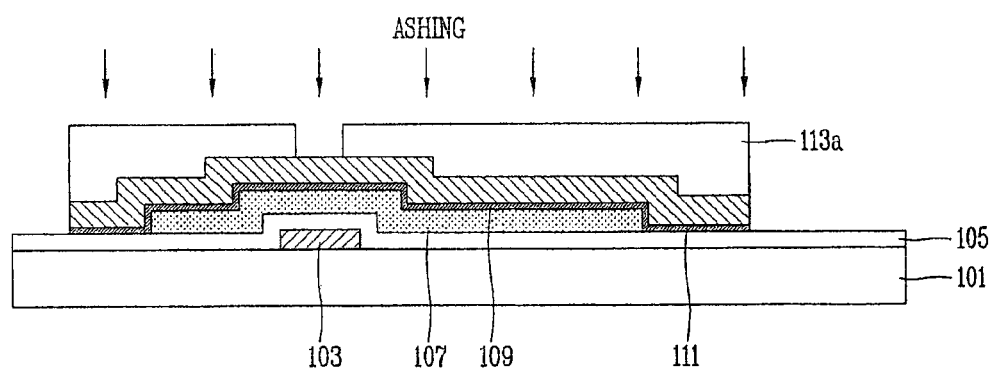
Figure 4G:
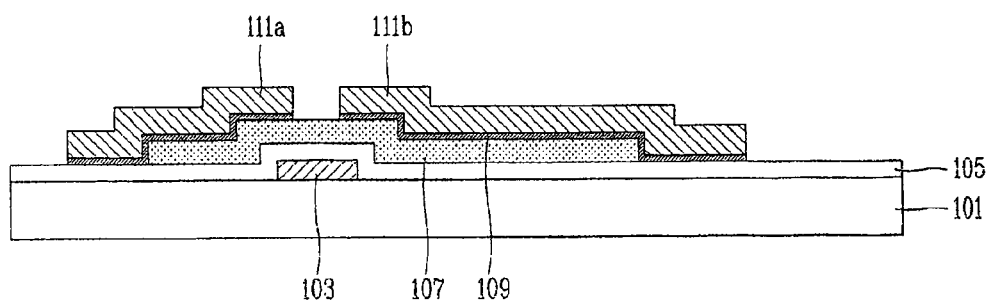
Figure 4H:
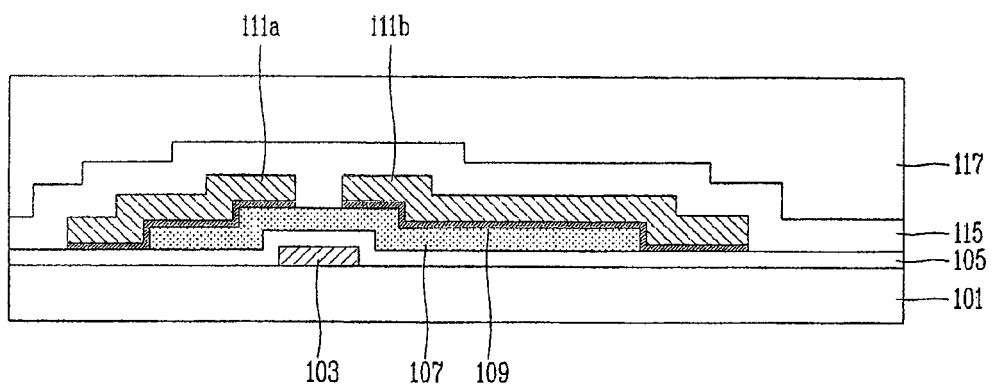
Figure 4I:
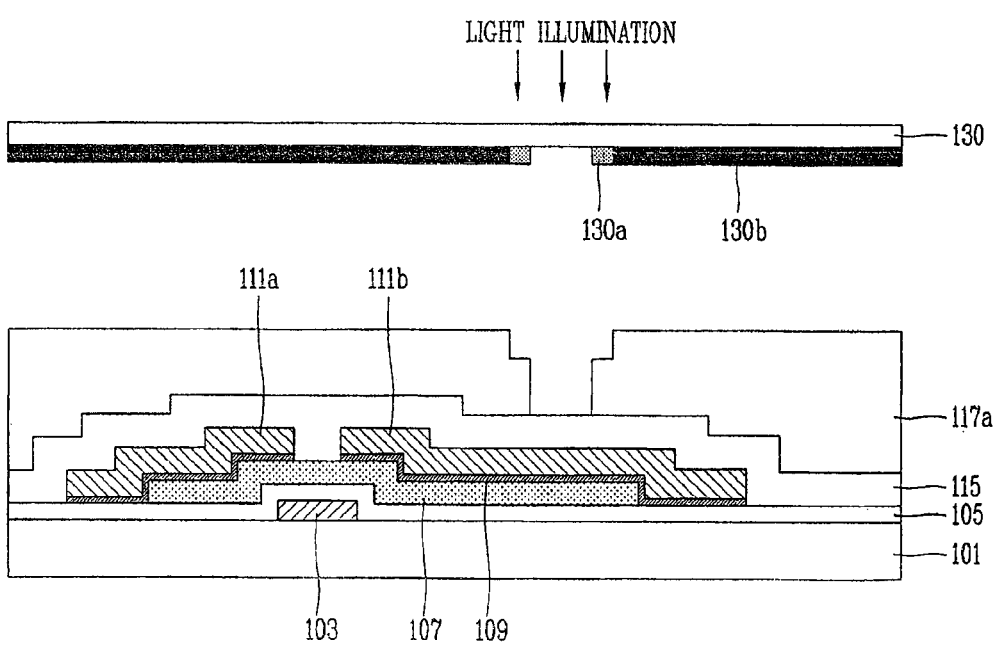
Figure 4J:
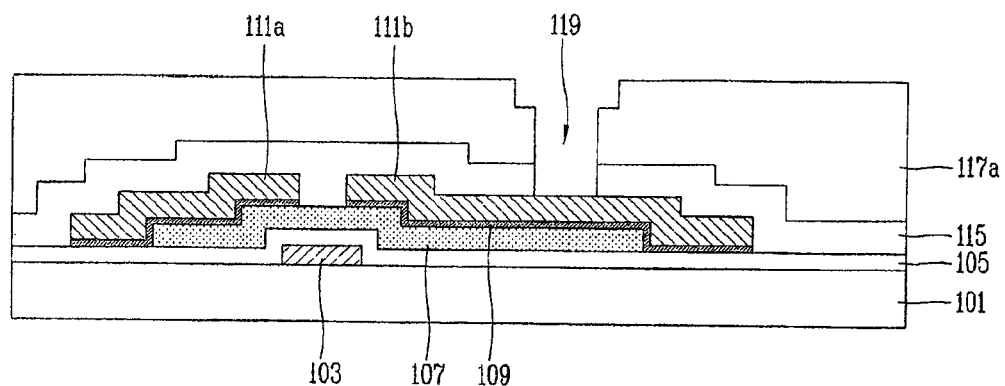
Figure 4K:
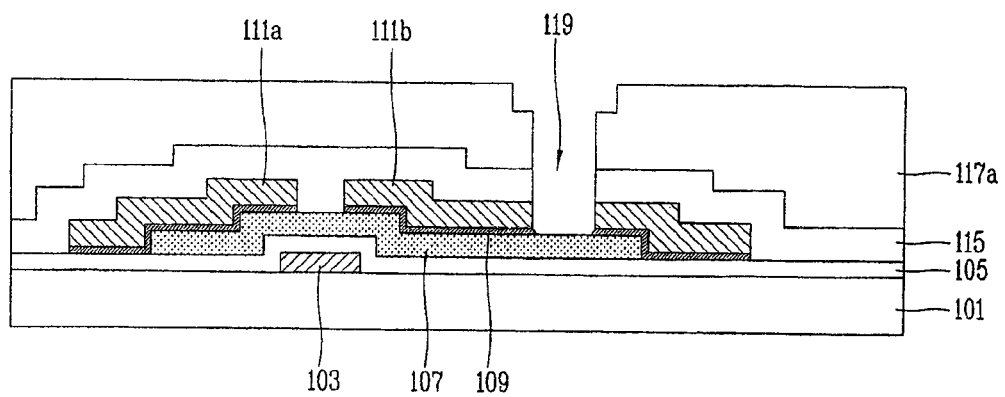
Figure 4L:
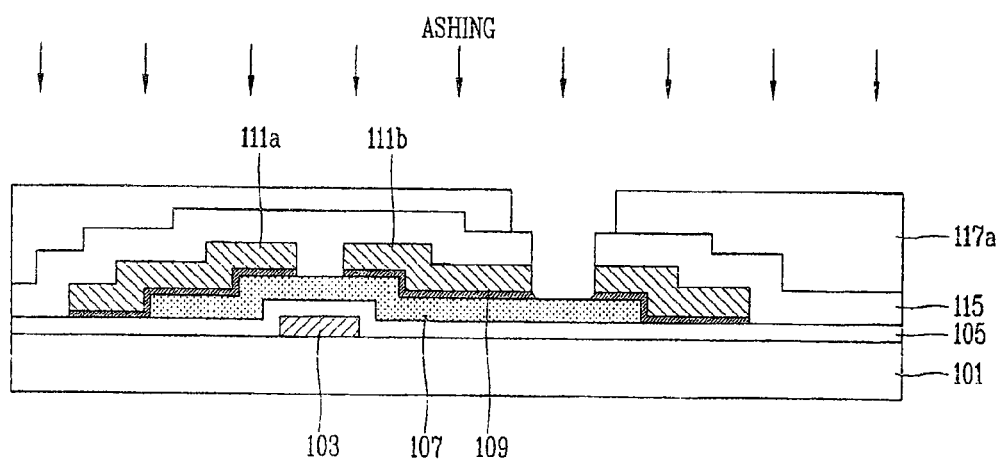
Figure 4M:
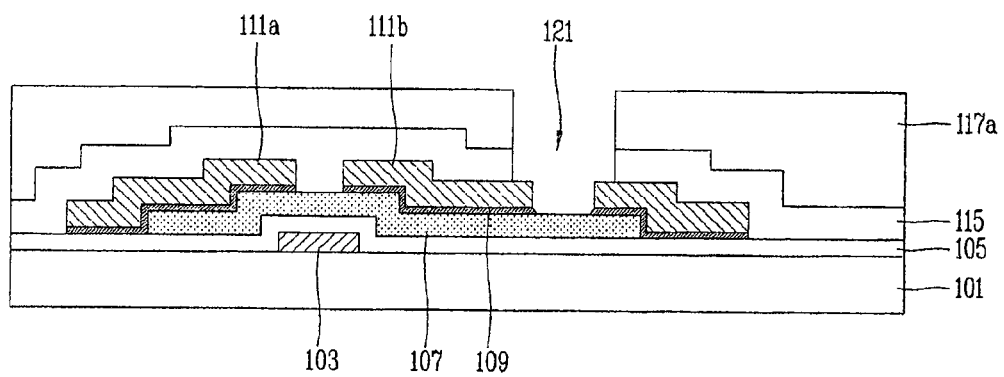
Figure 4N:
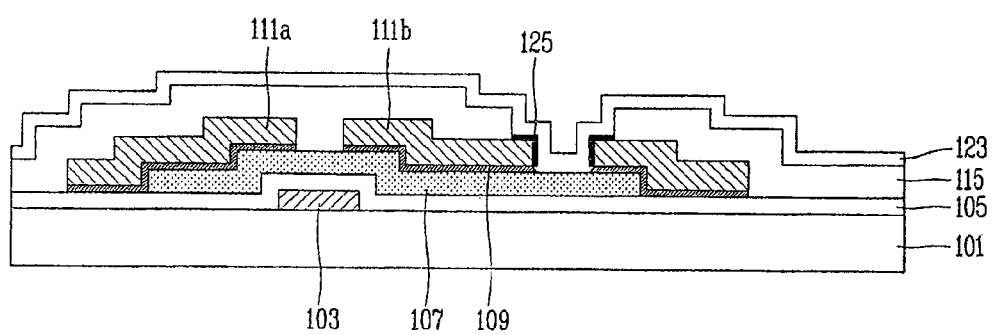
Figure 4O:
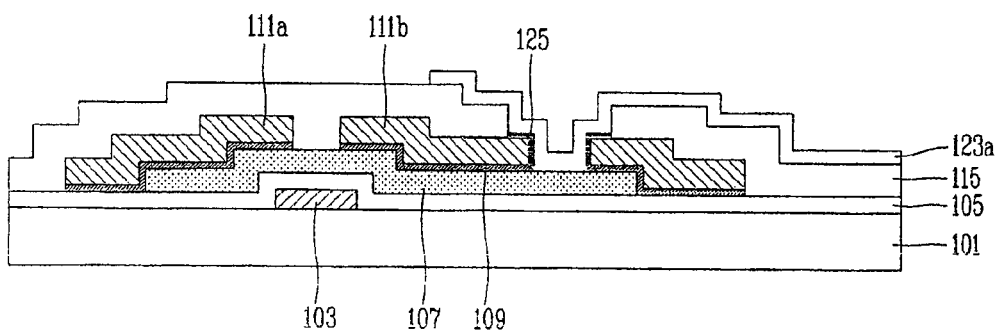

FIGS. 4a to 4o are sectional views sequentially showing a fabrication process of the array substrate for a display device according to an embodiment of the present invention.

As shown in FIG. 4a, one selected from the conductive metal group consisting of aluminum (Al), an aluminum alloy (AlNd), chromium (Cr), tungsten (W), molybdenum (Mo), and copper (Cu) is deposited on the transparent substrate 101 and patterned to form a plurality of gate wirings (not shown) in one direction and a plurality of gate electrodes 103 formed to be protruded from the gate wirings. In forming the gate wirings (not shown), the metal wiring of the gate/data pad, the pad (not shown) in the driving circuit portion, GIP or the metal wiring in the ESD (electrostatic discharge) circuit portion, may be formed.

And, not shown, a barrier metal wiring consisted of molybdenum titanium (MoTi), may be formed under the gate wiring, the metal wiring (not shown) in the gate/data pad, the pad of driving circuit portion, GIP and the metal wiring of ESD (electrostatic discharge) circuit portion.

One selected from the inorganic insulation material group consisting of silicon oxide film (SiO2) and a silicon nitride film (SiNx), or according to circumstances, from the organic insulation material group consisting of benzocyclobutene and acryl-based resin is deposited or coated to form the gate insulating layer 105.

Subsequently, the active layer 107 formed of amorphous silicon (a-Si:H) used as a channel region is formed on the gate insulating layer 105.

And then, although not shown, the first photosensitive film is coated on the active layer 107, exposure and etching process is performed through a photolithography using an exposure mask to form a first photosensitive film pattern (not shown) defining an active region.

Subsequently, as shown in FIG. 4b, the active layer 107 is selectively patterned by using the first photosensitive film pattern as a mask and removes the first photosensitive film pattern.

Thereafter, as shown in FIG. 4c, a molybdenum alloy is deposited through a sputtering method on the entire surface of the substrate 101 including the patterned active layer 107 to form the barrier metal layer 109. At this time, the barrier metal layer 109 serves to prevent an interaction between copper (Cu) constituting the source and drain electrodes to be formed in a follow-up process and the active layer 107 as they are directly in contact with each other. For the molybdenum alloy, one may be selected from the group consisting of titanium (Ti), tantalum (Ta), chromium (Cr), nickel (Ni), Indium (In), and aluminum (Al). In the present invention, the case of using titanium (Ti) for the molybdenum alloy will be described.

Subsequently, copper (Cu) is deposited through sputtering on the barrier metal layer 109 to form a copper metal layer 111, and a second photosensitive film 113 is coated on the copper metal layer 111.

And then, as shown in FIG. 4d, the second photosensitive film 113 is exposed and etched through a photography process using a diffraction mask (or slit mask) (not shown) to form a second photosensitive film pattern 113a. In this case, as the diffraction mask, a half-tone mask is used, and in addition, a slit mask may be also used.

The second photosensitive film pattern 113a includes a light blocking region and a half-tone region. The thickness of the pattern portion corresponding to the half-tone region is thinner than the pattern portion corresponding to the light blocking region. The reason is because, although not shown, a chromium film pattern is formed at the position corresponding to the light blocking region of the half-tone mask (not shown), and a translucent film pattern is formed at the position corresponding to the half-tone region of the half-tone mask. In addition, the half-tone region of the second photosensitive film pattern 113a corresponds to the channel region, and the light blocking region of the photosensitive film pattern 113a corresponds to the source and drain regions.

Thereafter, as shown in FIG. 4e, the copper metal layer 111 is selectively etched by using the second photosensitive film pattern 113 as a mask. At this time, when the copper metal layer 111 is etched, the barrier metal layer 109 is also etched.

And then, as shown in FIG. 4f, the second photosensitive film pattern 113a is selectively etched through an ashing process to expose an upper surface of the copper metal layer 111 corresponding to the position of the channel region.

Subsequently, as shown in FIG. 4g, the exposed copper metal layer 111 is selectively etched by using the ashed second photosensitive film pattern 113a to form the data wiring (not shown) vertically crossing the gate wiring (not shown) to define the pixel area, the source electrode 111a formed to be protruded upward of one side of the gate electrode 103 from the data wiring, and the drain electrode 111b spaced apart by a certain distance from the source electrode 111a. At this time, the barrier metal layer 109 is also etched when the copper metal layer 111 is etched to expose the channel region of the active layer 107.

And then, as shown in FIG. 4h, after the second photosensitive film pattern 113a is removed, one selected from the organic insulating material group, or according to circumstances, one from the inorganic insulating material group, is deposited to form the passivation film 115, and then, a third photosensitive film 117 is coated. At this time, as the material for formation of the passivation film 115, one selected from the inorganic insulation material group consisting of silicon oxide film (SiO2) and a silicon nitride film (SiNx), or according to circumstances, one selected from the organic insulation material group consisting of benzocyclobutene and acryl-based resin, as mentioned above, is deposited or coated.

Subsequently, as shown in FIG. 4i, the third photosensitive film 117 is exposed and etched through a photolithography using the half-tone mask 130 to from a third photosensitive film pattern 117a. At this time, besides the half-tone mask, a slit mask may be also used.

The third photosensitive film pattern 117a includes a light blocking region and a half-tone region. The thickness of the pattern portion corresponding to the half-tone region is thinner than the pattern portion corresponding to the light blocking region. The reason is because a translucent film pattern 130a is formed at the position corresponding to the half-tone region of the half-tone mask 130, and a chromium film pattern 130b is formed at the position corresponding to the light blocking region of the half-tone mask 130. Also, the half-tone region of the third photosensitive film pattern 117a corresponds to the drain contact hole formation region, and the half-tone region of the third photosensitive film pattern 117 is completely open to expose a portion of the passivation film 115.

And then, as shown in FIGS. 4j and 4k, the passivation film 115 is selectively etched by using the third photosensitive film pattern 117a as a mask, and then, a portion of the drain electrode 11b under the passivation film 115 is selectively etched to form a first contact hole 119. At this time, the passivation film 115 is subject to a dry etching process, and the drain electrode 111b and the barrier metal layer 119 are subject to a wet etching process. When the first contact hole 119 is formed, a side of the barrier metal layer 109 and the active layer 107 below the drain electrode 111b are exposed.

In particular, in forming the first contact hole 119, when the drain electrode 111b and the barrier metal layer 109 are etched, a portion of the barrier metal layer 109 is etched to expose its side and the active layer 107. That is, in etching the drain electrode 111b and the molybdenum titanium (MoTi) constituting the barrier metal layer 109, a portion of a side of the barrier metal layer 109 is not etched perfectly and is remained partly because the molybdenum titanium (MoTi) constituting the barrier metal layer 109 is etched slower than the copper (Cu) constituting the drain electrode 111b.

Subsequently, as shown in FIG. 4l, an ashing process is performed to etch the third photosensitive film pattern 117a up to a point where the portion corresponding to the half-tone region of the third photosensitive film pattern 117a is removed.

And then, as shown in FIG. 4m, the passivation film 115 is selectively etched by using the third photosensitive film pattern 113a as a mask to form a second contact hole 121 exposing an upper surface of the drain electrode 111b. At this time, the second contact hole 121 includes the first contact hole 119 and has a diameter larger than the first contact hole 119.

Thereafter, as shown in FIG. 4n, a conductive material layer 123 is deposited through sputtering on the second contact hole 121 including the first contact hole 119 and the passivation film 115 to form a conductive material layer 123. At this time, the conductive material may be selected from among ITO, AZO, ZnO, IZO, other transparent metal materials or molybdenum titanium (MoTi).

Although not shown, a fourth photosensitive film (not shown) is coated on the conductive material layer 123 and exposed and etched through a photolithography process to form a fourth photosensitive film pattern (not shown).

And then, as shown in FIG. 4o, the conductive material layer 123 is selectively etched by using the fourth photosensitive film pattern (not shown) is selective as a mask to form the pixel electrode 123a electrically connected with the barrier metal layer 109 and the drain electrode 111b via the first and second contact holes 119 and 121, and the remaining fourth photosensitive film pattern (not shown) is removed to thus complete fabrication of the array substrate for a display device. At this time, the copper oxide film 125 is generated on the interface of the drain electrode 111b in contact with the pixel electrode 123a. Meanwhile, the copper oxide film 125 is not generated on the interface of the barrier metal layer 109 in contact with the pixel electrode 123a.

As mentioned above, the molybdenum alloy, i.e., molybdenum titanium (MoTi), constituting the barrier metal layer 109 is in contact with ITO constituting the pixel electrode 123a.

Meanwhile, an array substrate for a display device according to a different embodiment and a structure contacting between the metal wiring (including the metal wiring (not shown) in the gate/data pads, the pad of driving circuit portion, GIP or the metal wiring of ESD (electro static discharge) circuit portion) and the pixel electrode of the present invention will now be described in detail with reference to FIG. 5.

Figure 5:
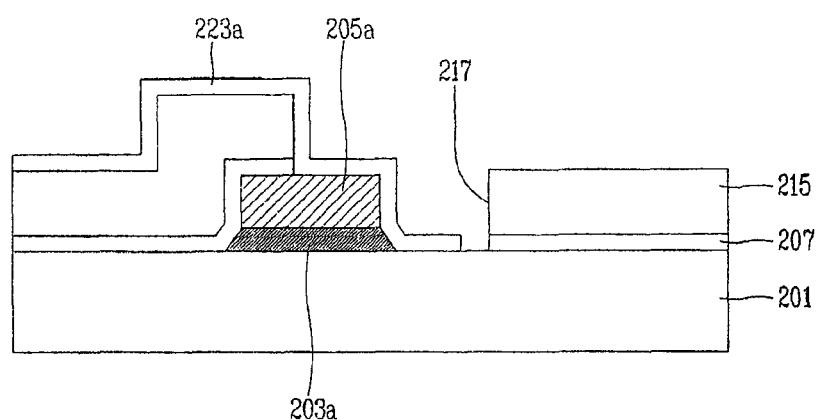
FIG. 5 is a schematic sectional view of an array substrate for a display device according to the present invention and a structure contacting between the metal wiring and the pixel electrode.

FIG. 5 is a schematic sectional view of an array substrate for a display device according to the present invention and a structure contacting between the metal wiring and the pixel electrode.

With reference to FIG. 5, the array substrate for a display device according to a different embodiment of the present invention includes a barrier metal layer pattern 203a and a metal wiring 205a (for example a gate/data pad, a pad of a driving circuit portion, GIP or a metal wiring of a ESD circuit portion) formed on a transparent substrate 201, a passivation layer 215 formed on the transparent substrate 201 including the barrier metal layer pattern 203a and the metal wiring 205a, a contact hole 217 formed in the passivation layer 215 and exposing parts of the barrier metal layer pattern 203a and the metal wiring 205; a pixel electrode 223a formed on the passivation layer 215 and contacting with the exposed barrier metal layer pattern 203a and the metal wiring 205a.

Here, a molybdenum alloy constituting the barrier metal layer pattern 203a may be one selected from the group consisting of titanium (Ti), tantalum (Ta), chromium (Cr), nickel (Ni), indium (In), and aluminum (Al). Here, the case where titanium (Ti) is used as the molybdenum alloy will now be described.

And, the metal wirings 205a of the pad of the gate/data pad, the driving circuit, GIP or the ESD circuit are formed by one selected from the conductive metal group consisting of aluminum (Al), an aluminum alloy (AlNd), chromium (Cr), tungsten (W), molybdenum (Mo), and copper (Cu) is deposited on the transparent substrate 201 and patterned to form a plurality of gate wirings (not shown).

Here, in forming the metal wiring 205a constituting the copper (Cu) and the barrier metal layer pattern 203a, a portion of a side of the barrier metal layer pattern 203a is not etched perfectly and is remained partly because the molybdenum titanium (MoTi) is etched slower than the copper (Cu) constituting the metal wiring 205a.

And, the pixel electrode 223a is formed by a conductive material selected from ITO, AZO, ZnO, IZO, or other transparent metal materials, or molybdenum titanium (MoTi) alloy.

Accordingly, because molybdenum titanium (MoTi) constituting the barrier metal layer, the copper wiring and the pixel electrode are directly in contact with each other to lower the contact resistance between the copper wiring used as the pad of the driving circuit, GIP, or the metal wiring of the ESD and the pixel electrode, and the contact resistance between the drain electrode and the pixel electrode can be lowered.

Meanwhile, the method for fabrication the array substrate for a display device according to a different embodiment and a structure contacting between the metal wiring (including the metal wiring (not shown) in the gate/data pad, pad of driving circuit portion, GIP or the metal wiring of ESD (electrostatic discharge) circuit portion) and the pixel electrode of the present invention will now be described with reference to FIGS. 6a to 6f.

FIGS. 6a to 6f are sectional views sequentially showing a fabrication process of the array substrate according to the present invention and a structure contacting between the metal wiring and the pixel electrode.

Figure 6A:
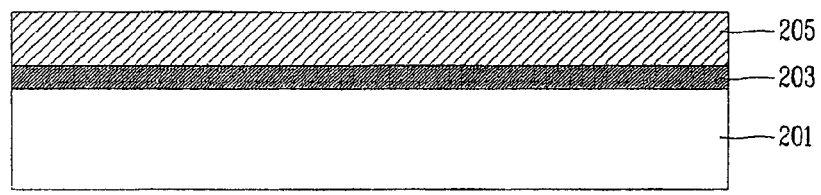
FIGS. 6a to 6f are sectional views sequentially showing a fabrication process of the array substrate according to the present invention and a structure contacting between the metal wiring and the pixel electrode.

As shown in FIG. 6a, a barrier metal layer 203 and a metal layer 205 are deposited on the transparent substrate 201. The barrier metal layer 203 is formed by the molybdenum alloy, one may be selected from the group consisting of titanium (Ti), tantalum (Ta), chromium (Cr), nickel (Ni), Indium (In), and aluminum (Al). And, the metal layer 205 is formed by one selected from the conductive metal group consisting of aluminum (Al), an aluminum alloy (AlNd), chromium (Cr), tungsten (W), molybdenum (Mo), and copper (Cu).

Figure 6B:
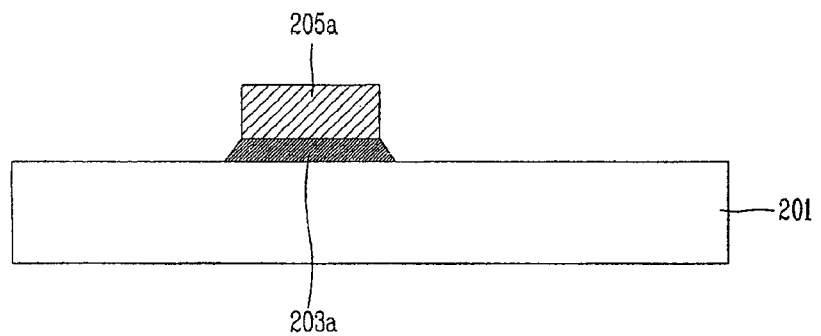

Thereafter, as shown in FIG. 6b, the metal layer 205 and the barrier metal layer 203 are etched and a metal wring 205a and a barrier metal layer pattern 203a are formed. Here, in forming the metal wiring 205a constituting the copper (Cu) and the barrier metal layer pattern 203a, a portion of a side of the barrier metal layer pattern 203a is not etched perfectly and is remained partly because the molybdenum titanium (MoTi) is etched slower than the copper (Cu) constituting the metal wiring 205a. And the metal wiring 205a may be used as the copper wiring of the gate pad, the data pad, the pad of the driving circuit, GIP, or the metal wiring of the ESD.

Figure 6C:
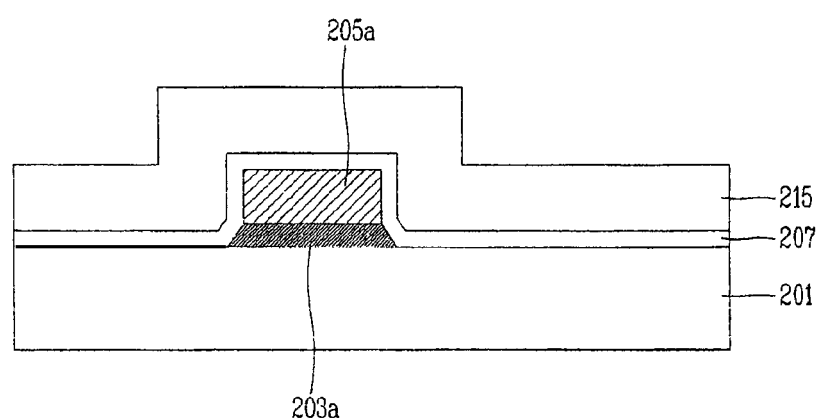

Thereafter, as shown in FIG. 6c, a gate insulating layer 207 and a passivation layer 215 are deposited on the substrate including the metal wiring 205a and the barrier metal layer pattern 203a.

Figure 6D:
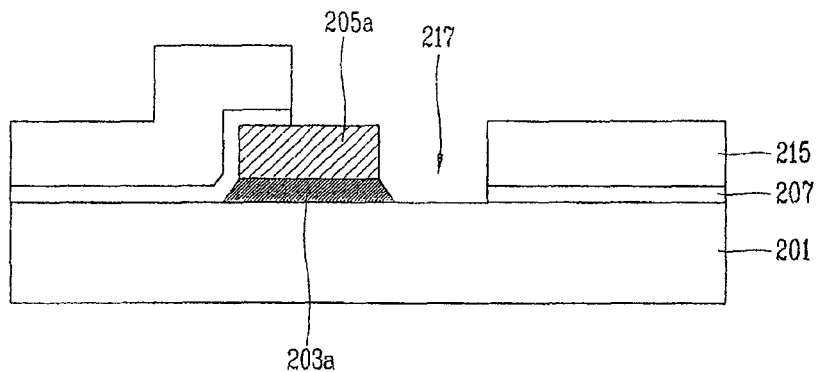

Thereafter, as shown in FIG. 6d, the passivation layer 215 and the gate insulating layer 207 are etched, and a contact hole 217 exposing portions of the metal wiring 205a, the barrier metal layer pattern 203a and the substrate 201 is formed.

Figure 6E:
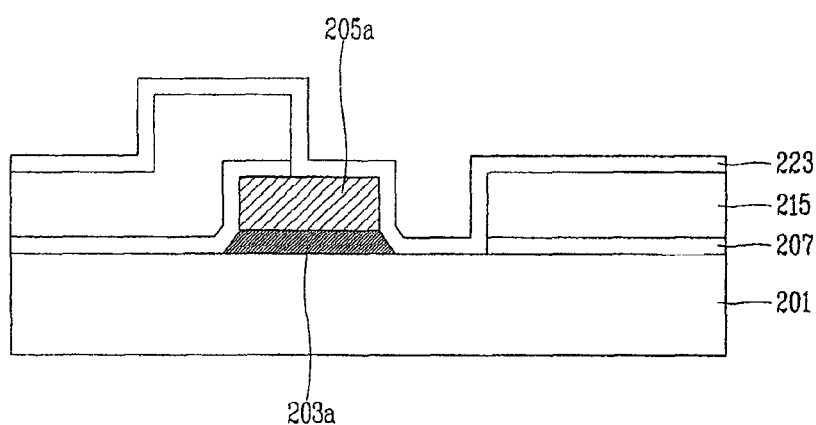

Thereafter, as shown in FIG. 6e, a conductive layer 223 is deposited on the passivation layer 217 including the contact hole 217. At this time, a conductive material for the conductive layer 223 may be selected from ITO, AZO, ZnO, IZO, other transparent metal materials or molybdenum titanium (MoTi) alloy. And, the conductive layer 223 is in contact with the metal wiring 205a and the barrier metal layer pattern 203a.

Figure 6F:
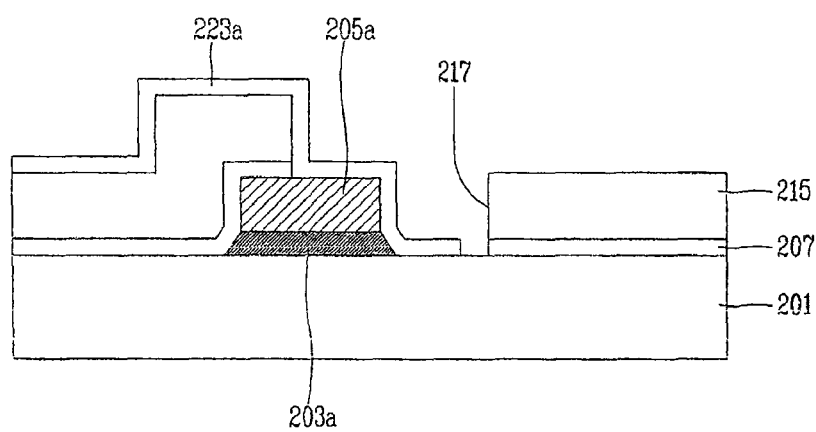

Thereafter, as shown in FIG. 6f, the conductive layer 223 is etched, and a conductive layer pattern 223a is formed. At this time, the conductive layer pattern 223a may be used as a pixel electrode. And, the conductive layer pattern 223a may be formed and extended on upper of the passivation layer 215.

Accordingly, because molybdenum titanium (MoTi), the copper barrier metal, and the pixel electrode are directly in contact with each other to lower the contact resistance between the copper wiring used as the metal wiring in the pad of the driving circuit, GIP, the metal wiring of the ESD and the pixel electrode can be lowered. And, a thin film transistor characteristic is improved and a contact resistance between the metal wiring and the pixel electrode is decreased under a lower voltage so that a current is increased.

Meanwhile, a structure of connecting between a barrier metal layer and a pixel electrode may be used as the structure of connecting between the metal wiring used in the pad of the driving circuit, GIP, or the metal wiring of the ESD, and the pixel electrode.

As so far described, the array substrate for a display device and its fabrication method have the following advantages.

That is, because molybdenum titanium (MoTi), the copper barrier metal, and the pixel electrode are directly in contact with each other to lower the contact resistance between the drain electrode, namely, the copper wiring, and the pixel electrode, and the contact resistance between the copper wiring used as the metal wiring in the pad of the driving circuit, GIP, the metal wiring of the ESD and the pixel electrode can be lowered. And, a thin film transistor characteristic is improved and a contact resistance between the metal wiring and the pixel electrode is decreased under a lower voltage so that a current is increased.

Thus, the TFT charging characteristics at a low Vds voltage can be improved by using the ohmic contact characteristics of the barrier metal layer and the pixel electrode. Also, it can help improve the linear mobility, making much influence on the product characteristics of a model to which a response time is applied.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An array substrate for a display device, comprising:
 a barrier metal layer and a metal wiring formed on a substrate;
 an insulating layer formed on the substrate including the metal wiring and the barrier metal layer;
 a passivation film formed on the insulating layer, and having a contact hole exposing a portion of the metal wiring and the barrier metal layer; and
 a conductive layer pattern formed on the passivation film and being in contact with the exposed metal wiring and the barrier metal layer through the contact hole, wherein the conductive layer pattern is in contact with a side surface of the barrier metal layer.

2. The substrate of claim 1, wherein the barrier metal layer is made of a molybdenum alloy using one selected from the group consisting of titanium (Ti), tantalum (Ta), chromium (Cr), nickel (Ni), indium (In), and aluminum (Al).

3. The substrate of claim 1, wherein the conductive layer pattern is made of an ITO-based transparent material such as ITO, AZO, ZnO or IZO, or molybdenum titanium (MoTi) alloy.

4. The substrate of claim 1, wherein the metal wiring is used as a metal wiring of a gate pad and a data pad, a driving circuit, a GIP (gate in panel) and a ESD circuit.

5. The substrate of claim 1, wherein the metal wiring is formed by a copper.

6. A method for fabricating an array substrate for a display device, the method comprising:
    forming a barrier metal layer and a metal wiring on a substrate;
    forming an insulating layer and a passivation film on the substrate including the metal wiring and the barrier metal layer;
    selectively etching the passivation film and the insulating layer to form a contact hole exposing a portion of the metal wiring and the barrier metal layer; and
    forming a conductive layer pattern on the passivation film and being in contact with the exposed metal wiring and the barrier metal layer through the contact hole, wherein the conductive layer pattern is in contact with a side surface of the barrier metal layer.

7. The method of claim 6, wherein the barrier metal layer is made of a molybdenum alloy using one selected from the group consisting of titanium (Ti), tantalum (Ta), chromium (Cr), nickel (Ni), indium (In), and aluminum (Al).

8. The method of claim 6, wherein the conductive layer pattern is made of an ITO-based transparent material such as ITO, AZO, ZnO or IZO, or molybdenum titanium (MoTi) alloy.

9. The method of claim 6, wherein the metal wiring is used as a metal wiring of a gate pad and a data pad, a driving circuit, a GIP (gate in panel) and a ESD circuit.

10. The method of claim 6, wherein the metal wiring is formed by a copper.

11. The method of claim 6, wherein the conductive layer pattern is used as a pixel electrode.

* * * * *